(12) United States Patent
Ma

(10) Patent No.: US 7,367,822 B2
(45) Date of Patent: May 6, 2008

(54) ELECTRICAL CONNECTOR WITH PICK UP CAP

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/645,393

(22) Filed: Dec. 26, 2006

(65) Prior Publication Data

US 2007/0184690 A1   Aug. 9, 2007

(30) Foreign Application Priority Data

Dec. 26, 2005   (TW) ............................. 94222621 U

(51) Int. Cl.
*H01R 13/44* (2006.01)
(52) U.S. Cl. ...................... 439/135; 439/940
(58) Field of Classification Search ................ 439/41, 439/135, 136, 138, 149, 342, 940
See application file for complete search history.

(56) References Cited

U.S. PATENT DOCUMENTS

| | | | |
|---|---|---|---|
| 6,875,022 B2 * | 4/2005 | Ma ............................. 439/41 |
| 6,905,353 B2 * | 6/2005 | Ma et al. ..................... 439/135 |
| 6,945,799 B2 * | 9/2005 | Huang ......................... 439/135 |
| 7,207,808 B2 * | 4/2007 | Ma ............................. 439/71 |
| 2002/0115315 A1 * | 8/2002 | Clayton ....................... 439/70 |
| 2004/0097104 A1 * | 5/2004 | Zhang .......................... 439/41 |
| 2004/0148442 A1 * | 7/2004 | Brice et al. ................... 710/8 |
| 2004/0166710 A1 * | 8/2004 | Ma ............................. 439/135 |
| 2004/0175974 A1 * | 9/2004 | Ma et al. ..................... 439/135 |
| 2007/0184690 A1 * | 8/2007 | Ma ............................. 439/135 |

* cited by examiner

*Primary Examiner*—James Harvey
(74) *Attorney, Agent, or Firm*—Wei Te Chung

(57) ABSTRACT

An electrical connector with a pick up cap comprises an electrical connector (2) and a pick up cap (1) mounted onto the connector (2). The electrical connector (2) comprises an insulative housing (20) defining a plurality of sidewalls (201) thereof, the sidewalls (201) cooperatively being adapted for receiving an electronic package therein, at least one sidewall defining a cutoff having two opposite slant walls (2100), a plurality of terminals (21) received in the housing (20), a pick up cap (1) mounted on the housing (2) comprising a base portion (2) having a flat smooth surface (2) at least an extending portion (2) extending from one end of the base portion (2) for compliantly engaging with the slant walls (2100) of the cutoff.

15 Claims, 5 Drawing Sheets

ELECTRICAL CONNECTOR WITH PICK UP CAP

BACKGROUND OF THE INVENTION

1. Field of the Invention

The present invention relates to an electrical connector with a pick up cap used for vacuuming the connector which comprises an electrical connector and a pick up cap, the pick up cap being incorporated with the connector for providing a flat smooth surface to be engaged by a vacuum suction device, whereby the connector assembly can be moved onto a circuit substrate such as a printed circuit board (PCB) on which the electrical connector is to be mounted.

2. Description of the Prior Art

As the technology developing, manual assembling is replaced by automatic assembling. In general, during the automation of assembling an electrical connector to a printed circuit board (PCB), frequently, a vacuum pick up device is used to pick up the electrical connector from one position to another position. However, referring to U.S. Pat. Nos. 6,413,111, 5,681,174, 5,651,684, 5,249,977 and 5,026,295, when picked up by a vacuum pick up device, the electrical connector has to define a smooth surface for being sucked by the pick up device. An article entitled "MicroPGA packages" (CONNECTOR SPECIFIER, May 2000, pp. 16~18) discloses an electrical connector for an electronic device. The connector defines a rectangular through hole in a center thereof for dissipating heat produced by the electronic device; therefore, the connector cannot be directly sucked by a vacuum pick up device. Generally, the connector is provided with a pick up cap for being sucked by the vacuum pick up device.

Referring to FIGS. 4 and 5, a conventional electrical connector assembly 6 comprises an electrical connector 8 and a pick up cap 9 vertically mounted on the connector 8. The connector 8 has an insulative housing 80 and a plurality of electrical terminals 81 received in the housing 80. The housing 80 is substantially rectangular, and defines a rectangular cavity 801 in a middle portion thereof for receiving an electrical package, such as a central processing unit (CPU) therein, and has a pair of opposite lateral sidewalls 800. A multiplicity of terminal-passages 803 are defined in a portion of the base around the cavity 801, for receiving a corresponding number of the terminals 81 therein. Two latches 8000 are defined in respective outer faces of the sidewalls 800 in a middle thereof. A cross-section of the latch 8000 is generally triangular.

The pick up cap 9 mounted on the electrical connector 8 includes a smooth base portion 91 having a flat smooth face thereon, a first and second extending portions 92, 93 extended from two opposite sides of the base portion 91. Extending portions 92, 93 and the base portion 91 are formed on the pick up cap 9 in alternate fashion, for being received in the two opposite lateral sidewalls 800 and the base respectively. The first and second extending portions 92, 93 each has two opposite parallel first and second arms 920, 930. A connecting portion 921 is connected on two cantilever ends of the first and second arms 920, 930. Two first clasps 922 each is extended perpendicularly from one end adjacent to the connecting portion 921 of the first arm 920 and are connected with a first latching arm 923. The two first clasps 922 and the first latching arm 923 cooperatively define a first cutoff 924 therebetween for receiving the latch 8000 of the housing 80 therein. Two second clasps 931 each is extended perpendicularly from the second arm 930 and are connected with a second latching arm 932. The two second clasps 931 and the second latching arm 932 cooperatively define a second cutoff 933 therebetween for receiving the other latch 8000 of the housing 80 therein.

In assembly, the pick up cap 9 is disposed right over a top of the housing 80, with the first and second latching arms 923, 932 loosely contacts the corresponding sidewalls 800. Then, the pick up cap 9 is pressed downwardly, with each of the first and second latching arms 923, 932 deflecting outwardly When the base portion 91 and the first and second extending portions 92, 93 of the pick up cap 9 are attached on the top of the housing 80, the two latches 8000 of the housing 80 interferentially inserting into the first and second cutoffs 924, 933 and engaging with the first and second latching arm 923, 933 respectively. Thus, the pick up cap 9 is fixed on the housing 80. The connector 8 is appropriately positioned on a PCB (not shown) by using a vacuum suction device (not shown) to suck the smooth surface of the pick up cap 9, thereby moving both the pick up cap 9 and the connector 8 to an appropriate place on the PCB.

However, In the above-described assembly process, the latches 8000 are interferentially engaged with the first and second cutoffs 924, 933, and the latches 8000 are defined in respective outer faces of the sidewalls 800. When the pick up cap 9 is detached from the housing 80, the normal force applied on the pick up cap 9 is taken in the direction indicated by the arrow F as shown in FIG. 8, the branch Fx of the force F along the direction of parallel to the pick up cap 9 will make the engagement between the pick up cap 9 and the housing 80 tighter. When this happens, the force applied on the pick up cap 9 will increase, it is difficult to detach the pick up cap 9 from the connector 8. In addition, the pick up cap 9 can not realize a accuracy position on the housing, especially not realize a position of the pick up cap relative to the housing in the horizontal plane.

Thus, there is a need to provide a new electrical connector assembly that overcomes the above-mentioned disadvantages is desired.

SUMMARY OF THE INVENTION

Accordingly, one main object of the present invention is to provide an electrical connector and a pick up cap mounted on the connector, where the pick up cap has configured to enforce an accurate position between the connector and the pick up cap.

To fulfill the above-mentioned object, an electrical connector with a pick up cap in accordance with a preferred embodiment comprises an electrical connector and a pick up cap mounted on the electrical connector. The connector includes an insulative housing and a multiplicity of terminals received therein. The housing has four raised sidewalls and the four sidewalls cooperatively define a generally rectangular base for receiving an electronic package such as a central processing unit (CPU) therein. Two opposite sidewalls each define a cutoff in middle thereof. Latching portions and a latch are positioned on lateral walls of the cutoff, respectively. The pick up cap includes a base portion, and a first and second extending portions extending from two opposite ends of the base portion respectively. A first and second clasps each is perpendicularly and downwardly extended from a corresponding cantilever end of the first and second extending portions. The first clasp has protrusions extending from two opposite lateral sides thereon. Two cantilever ends of the second clasps are connected with a latching arm. The two second clasps and the latching arm cooperatively define a recess portion, for inserting the latch of the housing therein. When the pick up cap is detached from the connector, the attachment of the protrusion and the latching portion is along the direction of parallel to the sidewalls of the housing, which can minimize the force applied on the pick up cap, and facilitate releasing the pick up cap from the connector.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
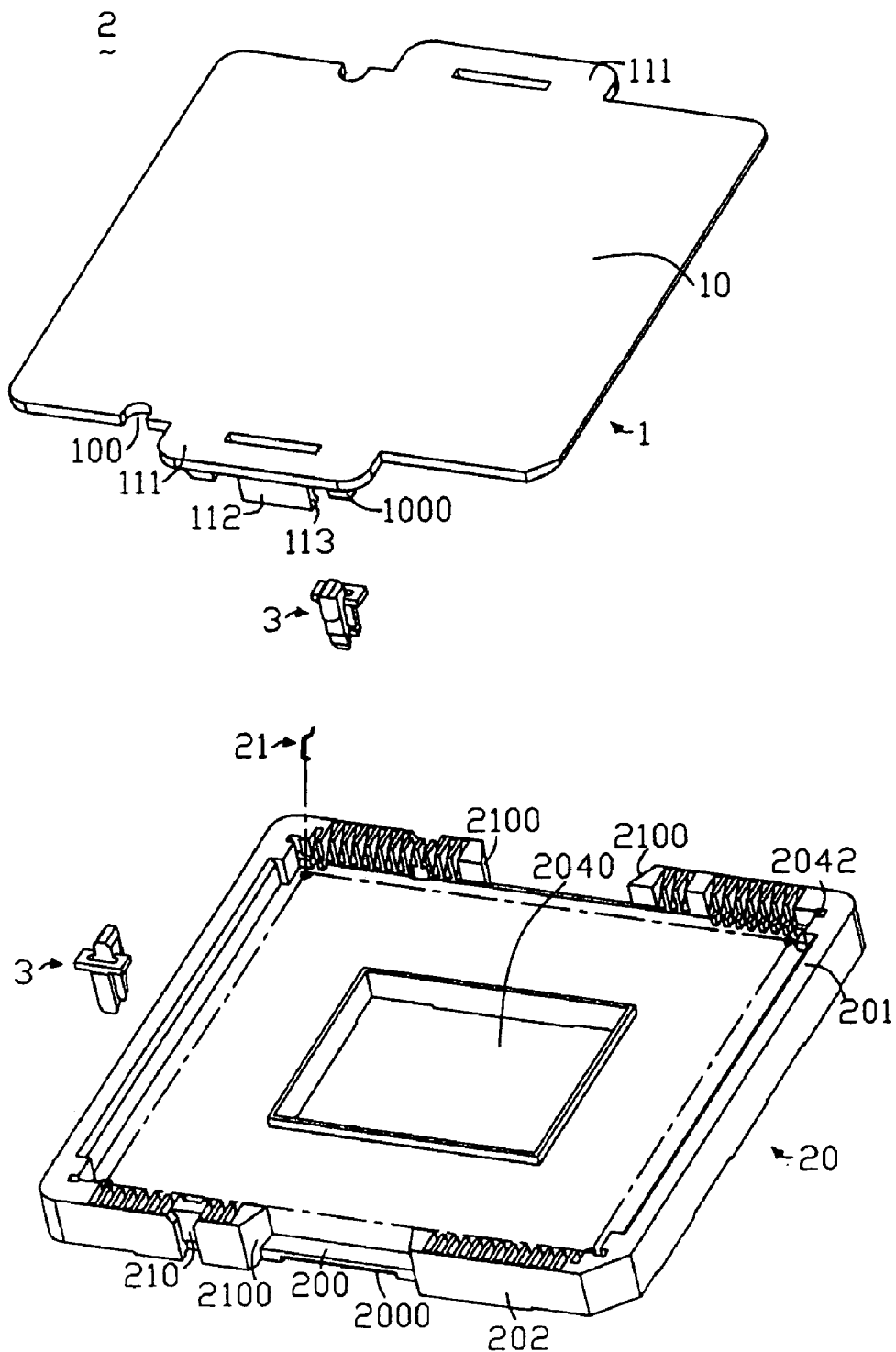
FIG. 1 is a simplified, exploded isometric view of an electrical connector.
Figure 2:
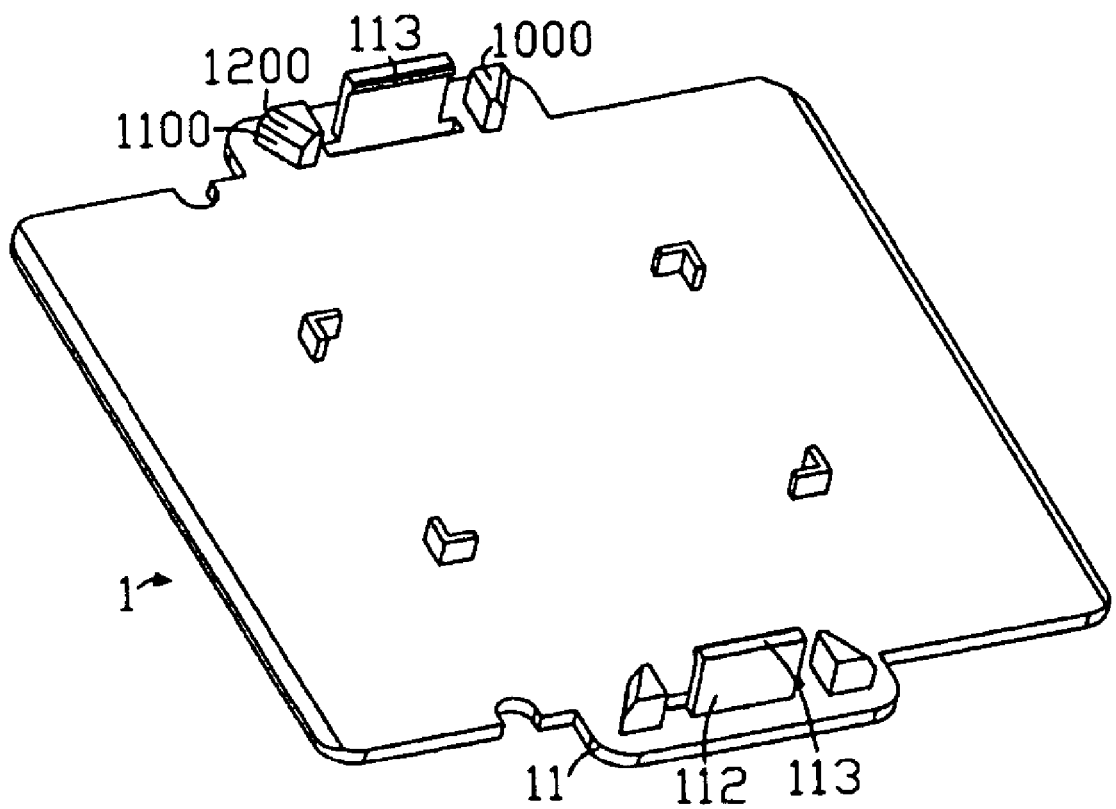
FIG. 2 is a bottom view of the pickup cap of the connector shown in FIG. 1.
Figure 3:
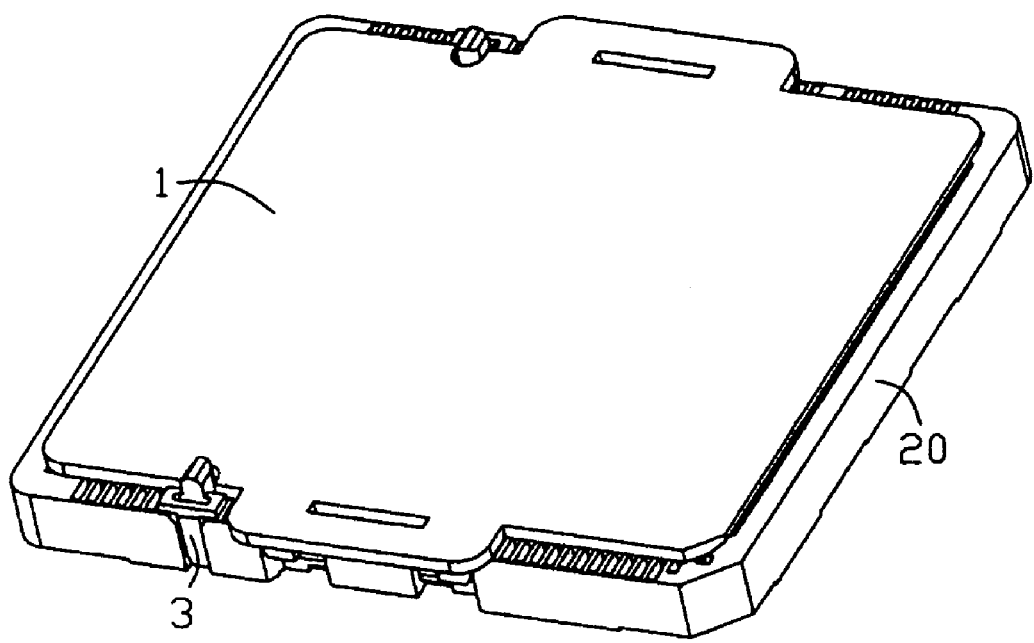
FIG. 3 is an assembled view of the connector shown in FIG. 1.
Figure 4:
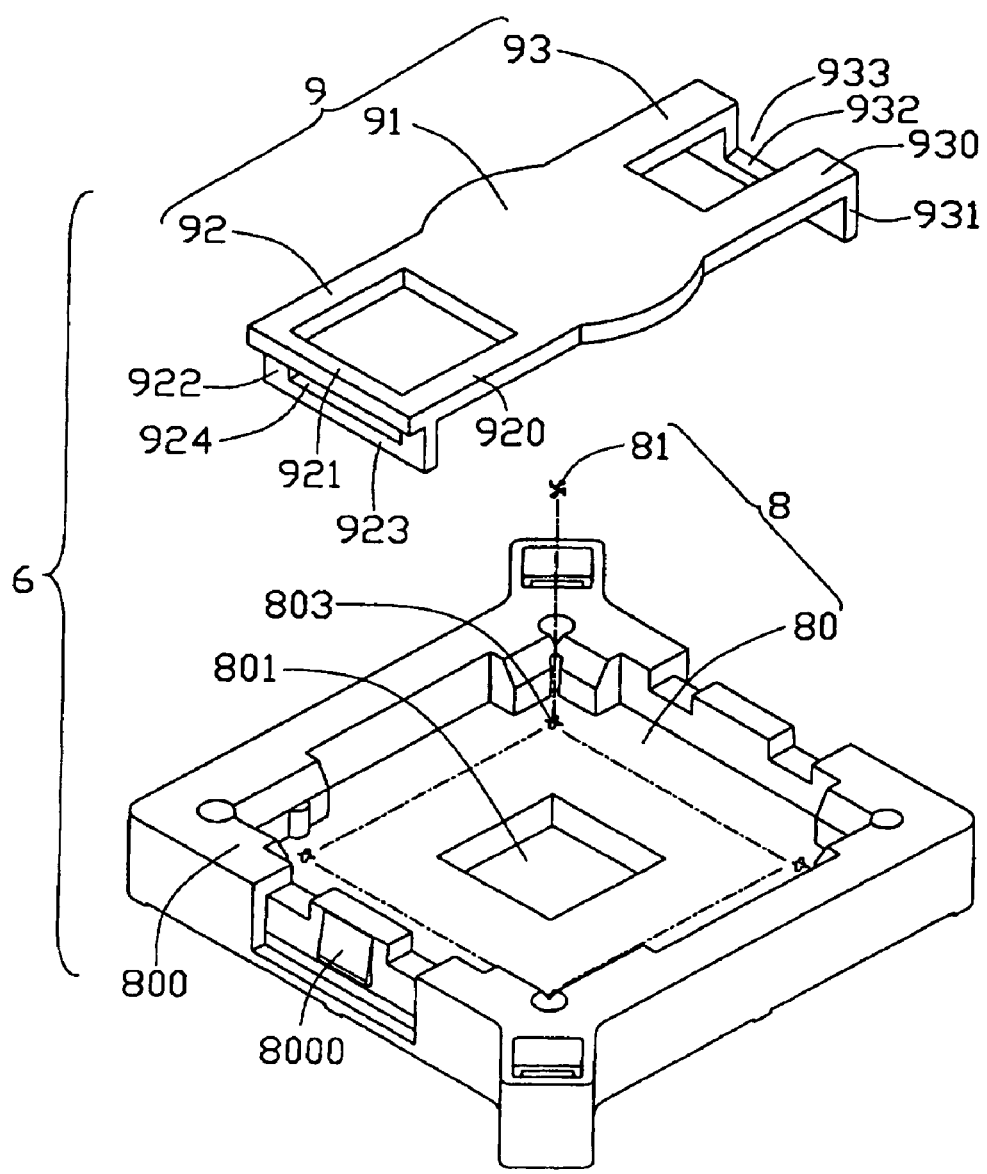
FIG. 4 is a simplified, exploded view of the conventional connector and the associated pick up cap.
Figure 5:
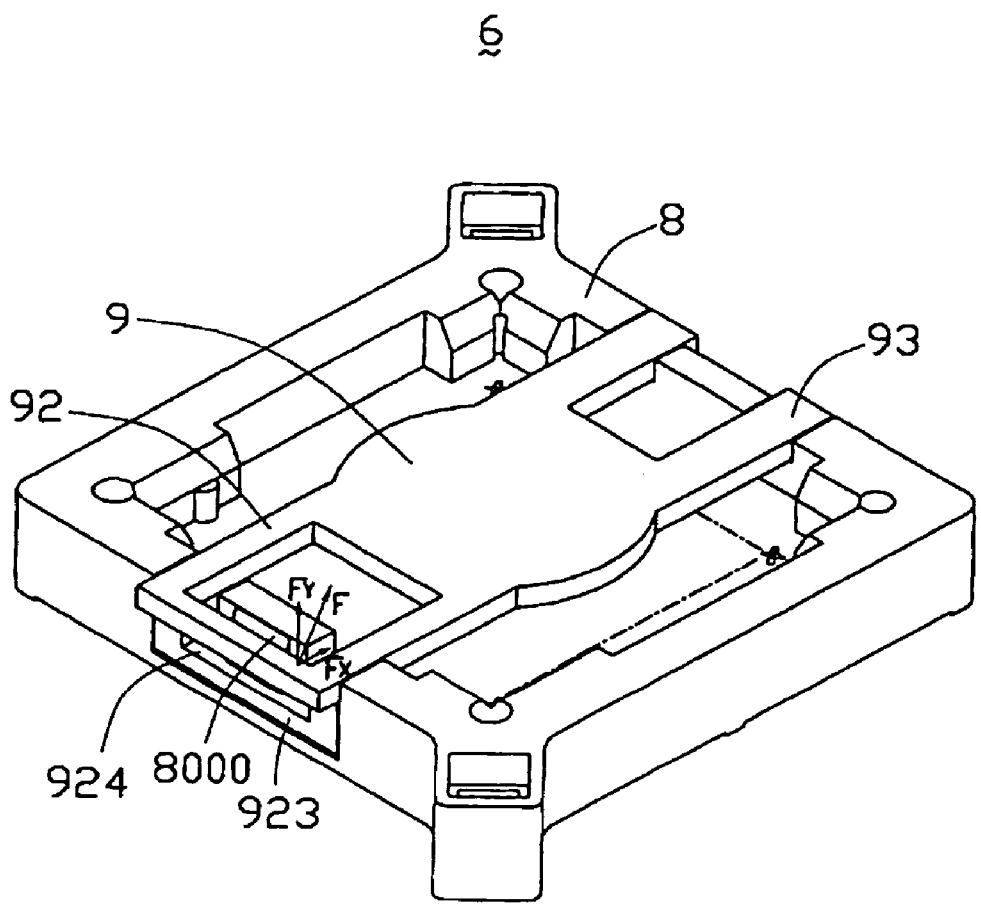
FIG. 5 is an assembled view of the conventional connector shown in FIG. 4

FIGS. 1-3 show a simplified, exploded isometric view of an electrical connector 2 having a pick up cap 1 according to the present invention. The electrical connector 2 comprises a housing 20 a number of contacts 21 received in the housing 20 and a pair of locking members 3 for locking the housing 20 and the pick up cap 1 together. The pick up cap 1 is mounted onto the connector 2, for providing a flat smooth surface to be engaged by a vacuum suction device (not shown). The electrical connector 2 can thereby be moved onto a circuit substrate, such as a printed circuit board (PCB) (not shown), on which the housing 20 is to be mounted.

The connector 2 comprises an insulative housing 20 and a multiplicity of terminals 21 received in the housing 20. The housing 20 is formed from dielectric material such as LCP (liquid crystal polymer) that can endure soldering temperatures, and is substantially a rectangular substrate. The housing 20 comprises a pair of transverse first sidewalls 201 opposite to each other, and two longitudinal second sidewalls 202 interconnecting the first sidewalls 201. The first and second sidewalls 201, 202 cooperatively define a base 204 therebetween for receiving a CPU package (not shown) therein. The base 204 defines a rectangular cavity 2040 in a middle thereof and a multiplicity of terminal-passages 2041 around the cavity 2040, for receiving a corresponding number of terminals 21 thereon. The second sidewalls 202 each symmetrically define a cut off in a middle portion thereof with a pair of mounting portions 200 respectively disposed below position thereof in accordance to the securing portions of the pick up cap, for holding the pick up cap 3 thereon. The mounting portions 200 each comprise a first and second receiving portions 2000 at two lateral ends in corresponding to the first and second hooks 113 of the pick up cap 1, and a pair of third sidewalls 2100 on the two sides of each mounting portion 200 for engaging with the first contacting surfaces 1100 of the projections 1000 of the pick up cap 1. The third sidewalls 2100 each extend from the lateral side of the second sidewall 202 towards the center of the housing 20 and grow close each other. In addition, the housing 20 defines a through recess 210 beside the mounting portion 200 in communication with the semicircle recess 100 for engaging with the locking member or alignment key 3 to have the housing 20 and the pick up cap 1 reliably assembled each other which prevents the housing 20 from sliding off from the pick up cap 1.

The pick up cap 1 comprises a base portion 10 having a flat smooth surface, a first and second extending portfons 11, 12 extending from two opposite ends of the base portion 10. The first and second extending portions 11 each comprise a pair of first and second arms 112, and a pair of securing portion 113 extending from the corresponding arms 112, respectively, and pairs of projections 1000 symmetrical arranged on two sides of the first and second arms 112. The projection 1000 is formed in an irregular shape and comprises a first engaging surface 1100 and a second engaging surface 1200 extending from the first engaging surface 1100, and the first and second surfaces 1100, 1200 are arranged to extend towards the center of the pick up cap 1 and close each other. The pick up cap 1 defines the first engaging surface 1100, which can solve the problem of the accurate position between the housing 20 and the pick up cap 1 and prevent the contacts received in the housing from being destroyed by the housing 20. The second engaging surface 1200 of the pick up cap 1 can lead the pick up cap 1 to engage with connector 2 for getting a simplified assembled process between the connector 2 and pick up cap 2. In addition, the pick up cap 1 further defines a semicircle recess 100 on sides of the base plate 10 for receiving the locking member 3 therein.

Referring to FIGS. 1-3, in attaching the electrical connector 2, the pick up cap 1 is disposed over the connector 2, with the arms 112 loosely contacting corresponding the mounting portions 200 respectively. That is the first hooks and the second hooks 113 are received into the recesses 2000 of the mounting portion 200 of the housing 20 and the projections 1000 besides the first arms and the second arm 122 are engaging with corresponding mounting portion 200 with the first engaging surfaces 1100 engaging with the third sidewalls 2100. Then the locking member 3 is used to locking the housing 20 and the pick up cap 1 together by the semicircle recess 100. The pick up cap 1 is thereby securely mounted onto the connector 2. With the first engaging surfaces of the projections engaging with the third sidewalls of the mounting portion, the pick up cap can realize an accurate position on the housing not only in a horizontal direction, but also in a vertical direction. In this position, a vacuum suction device (not shown) can engage the smooth surface of the base portion 10 in order to move the connector assembly 1 to a desired location on the PCB.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An electrical connector comprising:
an electrical connector, comprises:
an insulative housing defining a plurality of sidewalls thereof, the sidewalls cooperatively being adapted for receiving an electronic package therein, at least one sidewall defining a cutoff having two opposite slant walls;
a plurality of terminals received in the housing;
a pick up cap mounted on the housing, comprises:
a base portion having a flat smooth surface;

at least an extending portion extending from one end of the base portion for compliantly engaging with the slant walls of the cutoff;

at least one projection having a first engaging surface projecting from one end of the base portion and a second engaging surface extending from the first engaging surface, and the first and second engaging surfaces are arranged to extend towards the center of the pickup cap.

2. The electrical connector assembly of claim 1, wherein the extending portion comprises two parallel arms.

3. The electrical connector assembly of claim 2, wherein the arms comprise a first arm and a second arm opposite the first arm.

4. The electrical connector assembly of claim 2, wherein the extending portions comprise a first extending portion and a second extending portion opposite to the first extending portion.

5. The electrical connector assembly of claim 4, wherein a mating member is a clasp and extends perpendicularly from one end of the first extending portion, and a connecting portion interconnects the two first extending portion.

6. The electrical connector assembly of claim 4, wherein a mating member comprises a first mating member and a second mating member parallel to the first mating member.

7. The electrical connector assembly of claim 5, wherein the mating member comprise a protrusion disposed in lateral side of the clasp.

8. The electrical connector assembly of claim 6, wherein the two mating member are connected a latching arm at cantilever ends.

9. The electrical connector assembly of claim 2, wherein the housing defines a first and second receiving portions corresponding to the first and second arms.

10. The electrical connector assembly of claim 4, wherein the housing defines a first mounting portion and a second mounting portion corresponding to the first and second extending portion.

11. The electrical connector assembly of claim 8, wherein the housing defines latching portions and latches corresponding to protrusions and the latching arm.

12. The electrical connector assembly of claim 8, wherein a cross-section of the latch is generally triangular.

13. An electrical connector assembly comprising:

an insulative housing defining a circumferential wall defining a central receiving cavity to receive an electronic package;

a cutout defined in the circumferential wall, a pair of side engagement faces located by two sides of the cutout and opposite to each other, a mounting portion defined in the cutout with a receiving recess in an undersurface thereof;

a pickup cap defining a flat upper face with at least one leg corresponding to the mounting portion with at a distal end a hook engageably received in the receiving recess;

a pair of projections located by two sides of the leg and sideward engaged with the corresponding engagement faces;

wherein each engagement face and each corresponding projection respectively defines slanted structures for coupling with each other;

wherein the projection further defines a chamfer around the corresponding slanted structure thereof.

14. The electrical connector as claimed in claim 13, wherein said pair of projections are separated from the leg so that deflection of the leg during assembling or disassembling the pickup cap with regard to the housing will not affect the stable engagement between the engagement face and the corresponding projection.

15. The electrical connector as claimed in claim 13, wherein a detachable alignment key is mounted to a through recess in the circumferential wall and located beside the cutout, said alignment key including a portion extending into the central receiving cavity and the pickup cap defines a notch receiving said portion therein.

* * * * *